United States Patent
Wang

(10) Patent No.: US 10,424,250 B2
(45) Date of Patent: Sep. 24, 2019

(54) AMOLED DISPLAY DEVICE AND DRIVING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Zhenling Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 133 days.

(21) Appl. No.: 15/579,520

(22) PCT Filed: Nov. 20, 2017

(86) PCT No.: PCT/CN2017/111966
§ 371 (c)(1),
(2) Date: Dec. 4, 2017

(87) PCT Pub. No.: WO2019/071724
PCT Pub. Date: Apr. 18, 2019

(65) Prior Publication Data
US 2019/0228709 A1    Jul. 25, 2019

(30) Foreign Application Priority Data

Oct. 10, 2017  (CN) .......................... 2017 1 0936499

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3266* (2013.01); *G09G 3/3275* (2013.01);
(Continued)

(58) Field of Classification Search
CPC ......... G09G 3/3258; G09G 2300/0439; G09G 2300/0819; G09G 2310/08; G09G 2330/021
(Continued)

(56) References Cited

U.S. PATENT DOCUMENTS

| 2016/0049113 A1* | 2/2016 | Park | G09G 3/3225 |
| | | | 345/212 |
| 2016/0118022 A1* | 4/2016 | Chun | G09G 3/2007 |
| | | | 345/690 |
| 2017/0124958 A1* | 5/2017 | Pyo | G09G 3/3233 |

FOREIGN PATENT DOCUMENTS

| CN | 102203845 | 9/2011 |
| CN | 104885145 A | 9/2015 |
| CN | 107016965 | 8/2017 |

* cited by examiner

*Primary Examiner* — Michael Pervan
(74) *Attorney, Agent, or Firm* — Hauptman Ham, LLP

(57) ABSTRACT

This invention provides an AMOLED display device. The OLED panel comprises a plurality of subpixels. Each row of subpixels is electrically connected with one of the rows of OVSS. At least one of the subpixels located in a central area of the substrate is a detecting subpixel. While driving, a maximum value of the negative voltage of the detecting pixel is detected by the detection module, and the corresponding minimum positive voltage is obtained from the look-up table stored in the storage module according to the highest grayscale value and or the highest data signal voltage, and the maximum value of the negative voltage. Then a corresponding positive voltage to the OLED panel is generated from the voltage output module which is con-
(Continued)

trolled by the control signal. This invention provides a driving method of AMOLED display device with low power consumption and high display quality.

11 Claims, 8 Drawing Sheets

(51) Int. Cl.
 *G09G 3/3275* (2016.01)
 *H01L 51/52* (2006.01)
 *H01L 27/32* (2006.01)
(52) U.S. Cl.
 CPC ...... *H01L 27/3276* (2013.01); *H01L 51/5206* (2013.01); *H01L 51/5221* (2013.01); *G09G 2300/0439* (2013.01); *G09G 2300/0819* (2013.01); *G09G 2310/08* (2013.01); *G09G 2330/021* (2013.01)
(58) Field of Classification Search
 USPC .......................................... 345/204, 690, 211
 See application file for complete search history.

AMOLED DISPLAY DEVICE AND DRIVING METHOD THEREOF

RELATED APPLICATIONS

The present application is a National Phase of International Application Number PCT/CN2017/111966, filed Nov. 20, 2017, and claims the priority of China Application No. 201710936499.0, filed Oct. 10, 2017.

FIELD OF THE DISCLOSURE

This invention is related to a display technology, especially related to an AMOLED display device and its driving method.

BACKGROUND

There are a lot of advantages, such as self-luminosity, low driving voltage, high luminous efficiency, short response time, high definition and contrast, nearly 180 degree viewing angle, wide temperature range, flexible display and large area full color display in Organic Light Emitting Diode (OLED) display devices. It's a very promising display technology.

According the driving method, OLED can be cataloged into two types: passive driving and positive driving, (i.e. addressing directly or through TFT. The active driving is called Active Matrix(AM) type. Each light emitting unit is controlled and addressed by TFT in the AMOLED device. The pixel driving circuit including the light emitting unit and TFT addressing circuit is driven by OVSS through the traces.

With the progress of the display technology, AMOLED display devices are developed toward the large size and high resolution. Correspondingly, the larger size panels and a larger number of pixels will be required in the large size AMOLED display devices. However, the conductive resistance is larger while the wire is longer. Inevitably, it will cause an IR drop of the negative voltage on the wire. The negative voltage of th for each pixel driving circuit will be different because of the various resistance of the wire.

With reference to FIG. 1, the conventional AMOLED display device includes: a substrate 10, a subpixel arranged in a array on the substrate, a plurality of rows of OVSS traces 20 arranged on the substrate 10; each row of subpixels is electrically connected with one of the rows of OVSS traces 20 where a negative voltage OVSS applied on. The negative voltage OVSS is inputted into the OVSS traces 20 from the edges of substrate 10. Due to the IR drop, the negative voltage OVSS of the subpixel in the center area of the substrate 10 is larger than the subpixel in the edge of the substrate 10 when AMOLED is on the display mode.

With reference to FIG. 2, the AMOLED device includes a first thin film transistor T100, a second thin film transistor T200, a capacitor C300 and an organic light emitting diode D100. In the first thin film transistor T100, the gate of is connected with a scan signal SCAN, the source is connected with a data signal DATA and the drain is connected with the gate of the second thin film transistor T200. In the second thin film transistor T200, the drain is connected with the positive voltage OVDD, and the source is connected with the anode of the organic light emitting diode D100. The two edges of the capacitor C100 are respectively connected with the gate and the source of the second thin film transistor T200. The cathode of the organic light emitting diode D100 is connected with the corresponding OVSS trace 20 and the negative voltage OVSS is applied on it.

When the subpixel arranged in the center area of the substrate 10 receives an elevated negative voltage OVSS due to the IR drop, the voltage on the gate of the second thin film transistor T200, acting as the driving TFT, will be elevated as well due to the capacitor coupling effect. This will shift the breakpoint voltage. In the conventional technology, the driving TFE is in the saturation region during displaying. This make the current passing through the driving TFT and the organic light emitting diode D100 steady. To lower the power consumption of driving the voltage on the drain of the driving TFT can be lowered (i.e. lowering down the positive voltage OVDD). In the conventional method, the impact on negative voltage due to the IR drop is not considered and it only based on the highest grayscale value or the highest data signal voltage to adjust the positive voltage OVDD. However, the driving TFT of the subpixel is still on the linear region. This incurs the bed uniformity in display.

SUMMARY

One object of the present invention is to provide an AMOLED display device with lower power consumption and higher display quality.

Another object of the present invention is to provide an AMOLED display driving method to lower down the power consumption and improve the display quality.

To achieve the objects aforesaid, the present invention provides an AMOLED display device, includes: an OLED panel, a detection module electrically connected with the OLED panel, a control module electrically connected with the detection module, a communication module electrically connected with the control module, a storage module electrically connected with the control module, and a voltage output module electrically connected with the control module and the OLED panel;

wherein the OLED panel comprises a substrate, a plurality of subpixels arranged in an array on the substrate, and a plurality of rows of OVSS traces arranged on the substrate; each row of subpixels is electrically connected with one of the rows of OVSS where a negative voltage applied on; and at least one of the subpixels located in a central area of the substrate is a detecting subpixel, and the detecting subpixel is electrically connected with the detection module;

wherein the detection module is for acquiring the negative voltage applied on the OVSS trace to the corresponding detecting subpixel to obtain a maximum value of the negative voltage applied to the detecting subpixel and transmit the maximum value to the control module; the communication module is for receiving a display signal and transmitting the display signal to the control module, the display signal comprises a highest grayscale value or a highest data signal voltage in a picture to be displayed, and a frame synchronization signal; the storage module is for storing a preset value of the highest grayscale or the highest data signal, the negative voltage, and a minimum positive voltage of the picture to be displayed, and forming a look-up table; the control module is for obtaining a minimum positive voltage from the look-up table of the storage module according to the value of the maximum grayscale or the maximum data signal voltage in the picture to be displayed and the maximum value of the negative voltage applied on the detecting subpixel, and for generating a control signal from the look-up table to be transmitted to the voltage output module and updating the control signal according to the frame synchronization signal; and wherein the voltage output module is for generating a corresponding positive voltage output to the OLED panel according to the control signal.

In one embodiment of the present invention, the detecting subpixel comprise a first thin film transistor, a second thin film transistor, a third thin film transistor, a first capacitor, and a first organic light emitting diode.

In another embodiment of the present invention, a gate of the first thin film transistor is electrically connected to a scan signal, a source of the first thin film transistor is electrically connected to a data signal, and a drain of the first thin film transistor is electrically connected to a gate of the second thin film transistor; a drain of the second thin film transistor is electrically connected to the voltage output module connecting to the positive voltage and a source of the second thin film transistor is connected to the anode of the first organic light emitting diode; a gate of the third thin film transistor is electrically connected to a sensing signal, a source of the third thin film transistor is electrically connected to a cathode of the first organic light emitting diode, the first capacitor is electrically connected to a gate and a drain of the second TFT; the cathode of the first organic light emitting diode is electrically connected to the OVSS trace correspondingly.

In the other embodiment, each of the subpixels other than the detecting subpixel comprises a fourth TFT, a fifth TFT, a second capacitor, and a second organic light emitting diode.

In the other embodiment, a gate of the fourth thin film transistor is connected to the scan signal, a source is connected to the data signal, and a drain of the fourth thin film transistor is electrically connected to a gate of the fifth thin film transistor; a drain of the fifth thin film transistor is electrically connected to a voltage output module which is electrically connected to the anode of the positive voltage, a source of the fifth thin film transistor is electrically connected to the anode of the second organic light emitting diode; two ends of the second capacitor are electrically connected to the gate and the drain of the fifth thin film transistor respectively; the cathode of the second organic light emitting diode connecting to the OVSS traces correspondingly.

The detecting module obtains the negative voltage applied on the OVSS trace corresponding to the detecting subpixel, the sensing signal controls the third thin film transistor to be turned on Preferably, the AMOLED display device further include a source driver chip electrically connected to the communication module and the OLED panel, the display signal being transmitted from the source driver chip to the communication module.

Preferable, the AMOLED display device further includes a timing controller electrically connected to the communication module and a source driver chip electrically connected to both the timing controller and the OLED panel, wherein the display signal is transmitted by the timing controller to the communication module.

This invention also provides a driving method of AMOLED display device. The driving method includes:

step S1, providing the AMOLED display device according to claim 1;

step S2, storing a highest grayscale value or a highest data signal voltage, a negative voltage and a minimum positive voltage in a preset picture to be displayed in the storage module to form a look-up table step S3: obtaining the negative voltage to the OVSS trace corresponding to the detecting subpixel to obtain a maximum value of the negative voltage of the detecting subpixel, wherein the communication module receives the display signal and transmits the negative signal to the control module; the display signal comprises the highest gray scale value or the highest data signal voltage in the picture to be displayed, and a frame synchronization signal;

step S4: obtaining the minimum positive voltage from the look-up table of the storage module according to the maximum grayscale value or the maximum data signal voltage in the picture to be displayed and the maximum value of the negative voltage applied to the detecting subpixel, generating a corresponding control signal to the voltage output module, and updating the control signal according to the frame synchronization signal; and step S5, the voltage output module generates a corresponding positive voltage for outputting to the OLED panel according to the control signal.

In one embodiment of the present invention, the detecting subpixel comprise a first thin film transistor, a second thin film transistor, a third thin film transistor, a first capacitor, and a first organic light emitting diode.

In another embodiment of the present invention, a gate of the first thin film transistor is electrically connected to a scan signal, a source of the first thin film transistor is electrically connected to a data signal, and a drain of the first thin film transistor is electrically connected to a gate of the second thin film transistor; a drain of the second thin film transistor is electrically connected to the voltage output module connecting to the positive voltage and a source of the second thin film transistor is connected to the anode of the first organic light emitting diode; a gate of the third thin film transistor is electrically connected to a sensing signal, a source of the third thin film transistor is electrically connected to a cathode of the first organic light emitting diode, the first capacitor is electrically connected to a gate and a drain of the second TFT; the cathode of the first organic light emitting diode is electrically connected to the OVSS trace correspondingly.

In the other embodiment, each of the subpixels other than the detecting subpixel comprises a fourth TFT, a fifth TFT, a second capacitor, and a second organic light emitting diode.

In the other embodiment, a gate of the fourth thin film transistor is connected to the scan signal, a source is connected to the data signal, and a drain of the fourth thin film transistor is electrically connected to a gate of the fifth thin film transistor; a drain of the fifth thin film transistor is electrically connected to a voltage output module which is electrically connected to the anode of the positive voltage, a source of the fifth thin film transistor is electrically connected to the anode of the second organic light emitting diode; two ends of the second capacitor are electrically connected to the gate and the drain of the fifth thin film transistor respectively; the cathode of the second organic light emitting diode connecting to the OVSS traces correspondingly.

In the other embodiment, the step S3 further comprises the sensing signal controls the third thin film transistor to be turned on when the detecting module obtains the negative voltage to the OVSS trace corresponding to the detecting subpixel.

Preferably, the AMOLED display device further include a source driver chip electrically connected to the communication module and the OLED panel, the display signal being transmitted from the source driver chip to the communication module.

Preferable, the AMOLED display device further includes a timing controller electrically connected to the communication module and a source driver chip electrically connected to both the timing controller and the OLED panel, wherein the display signal is transmitted by the timing controller to the communication module.

This invention also provides an AMOLED display device, comprising an OLED panel, a detection module electrically connected with the OLED panel, a control module electrically connected with the detection module, a communication module electrically connected with the control module, the control module electrically connected with the storage module, and voltage output module electrically connected to the control module and the OLED panel;

wherein the OLED panel comprising a substrate, a plurality of subpixels arranged in array on the substrate, and a plurality of rows of OVSS traces arranged on the substrate. each row of subpixels is correspondingly electrically connected with a row of OVSS traces and is formed by a corresponding OVSS. And at least one sub-pixel located in a central area of the substrate is a detection sub-pixel, and the detection sub-pixel is electrically connected with the detection module;

wherein the detection module is configured to acquire a negative voltage to the OVSS trace corresponding to the detection sub-pixel to obtain a maximum value of the negative voltage to the detection sub-pixel and transmit the maximum value to the control module; the communication module is configured to receive a display signal and transmit the control signal to a control module, wherein the display signal comprise a highest grayscale value or a highest data signal voltage in a picture to be displayed, and a frame synchronization signal;

wherein the storage module is configured to store a preset between a highest grayscale value or a highest data signal voltage, a negative power supply voltage, and a minimum positive power supply voltage to be displayed, and forming a look-up table; according to a maximum grayscale value or a maximum data signal voltage in a picture to be displayed and a maximum value of a negative power supply voltage input to the detection sub-pixel, the control module is configured to obtain a corresponding minimum positive power supply voltage forming a look-up table of the memory module, generating a corresponding control signal from the look-up table to be transmitted to the voltage output module and configuring to update the control signal according to the frame synchronization signal;

wherein the voltage output module is configured to generate a corresponding positive power voltage output to the OLED panel according to the control signal. wherein the detecting sub-pixel comprises a first thin film transistor, a second thin film transistor, a third thin film transistor, a first capacitor, and a first organic light emitting diode. a gate electrode of the first thin film transistor is connected to a scan signal, a source electrode is connected to a data signal, and a drain electrode is electrically connected to a gate electrode of the second thin film transistor; a drain electrode of the second thin film transistor is electrically connected to a voltage output module and the voltage, the cathode is electrically connected to the anode of the first organic light emitting diode; the gate of the third thin film transistor is connected to the sensing signal, the source of the third thin film transistor is electrically connected to the cathode of the first organic light emitting diode, the first capacitor is electrically connected to the gate and the drain of the second TFT; the cathode of the first OLED is electrically connected to a corresponding OVSS trace; each of the sub-pixels excluding the detection sub-pixel comprises a fourth TFT, a fifth TFT, a second capacitor, and a second organic light emitting diode;

wherein a gate of the fourth thin film transistor is connected to a scan signal, a source is connected to a data signal, and a drain of the fourth thin film transistor is electrically connected to a gate of the fifth thin film transistor; a drain of the fifth thin film transistor is electrically connected to a voltage output module and the voltage, the cathode is electrically connected to the anode of the second organic light emitting diode; the two ends of the second capacitor are electrically connected to the gate and the drain of the fifth thin film transistor respectively; the cathode of the second organic light emitting diode connecting to the corresponding OVSS traces.

wherein the detecting module obtains the negative voltage to the OVSS trace corresponding to the detecting sub-pixel, the sensing signal controls the third thin film transistor to be turned on wherein the display device further comprises a source driver chip electrically connected to the communication module and the OLED panel, the display signal being transmitted from the source driver chip to the communication module, This invention provides an AMOLED display device. The OLED panel comprises a plurality of subpixels. Each row of subpixels is electrically connected with one of the rows of OVSS. At least one of the subpixels located in a central area of the substrate is a detecting subpixel. While driving, a maximum value of the negative voltage of the detecting pixel is detected by the detection module, and the corresponding minimum positive voltage is obtained from the look-up table stored in the storage module according to the highest grayscale value and or the highest data signal voltage, and the maximum value of the negative voltage. Then a corresponding positive voltage to the OLED panel is generated from the voltage output module which is controlled by the control signal. This technology improves the power consumption of the AMOLED device significantly and the display quality. This invention provides a driving method of AMOLED display device with low power consumption and high display quality.

BRIEF DESCRIPTION OF THE DRAWINGS

For further understanding of the features and technical contents of the present invention, please refer to the following detailed description and accompanying figures of the present invention. However, the figures are for reference only and do not intend to limit the present invention.

In the figures.

DETAILED DESCRIPTION OF PREFERRED EMBODIMENTS

To further illustrate the technical means adopted by the present invention and the effects thereof, the following describes in detail the preferred embodiments of the present invention and the accompanying drawings.

Figure 1:
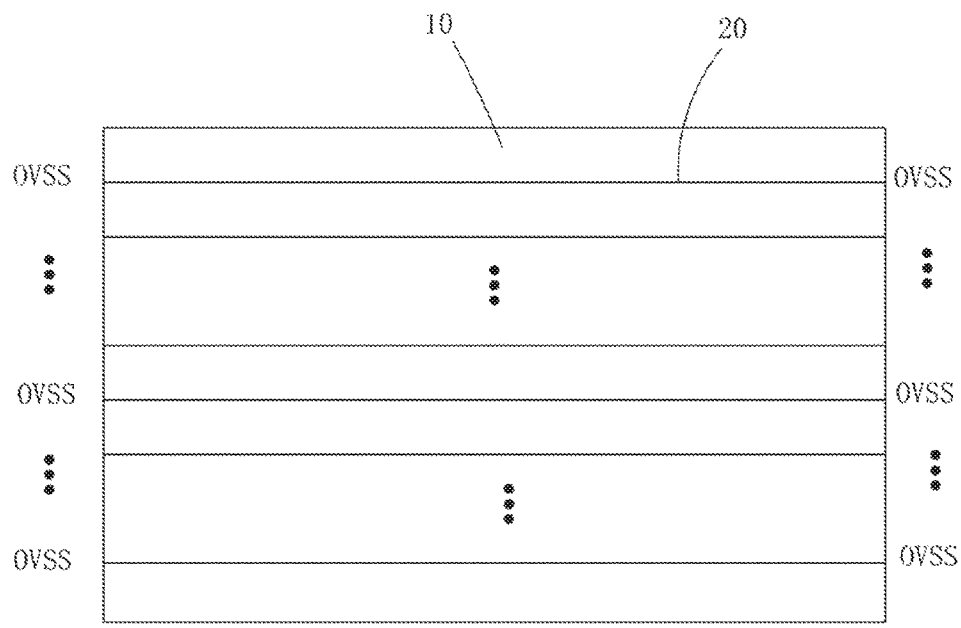
FIG. 1 is a schematic top view of a conventional AMOLED display device.
Figure 2:
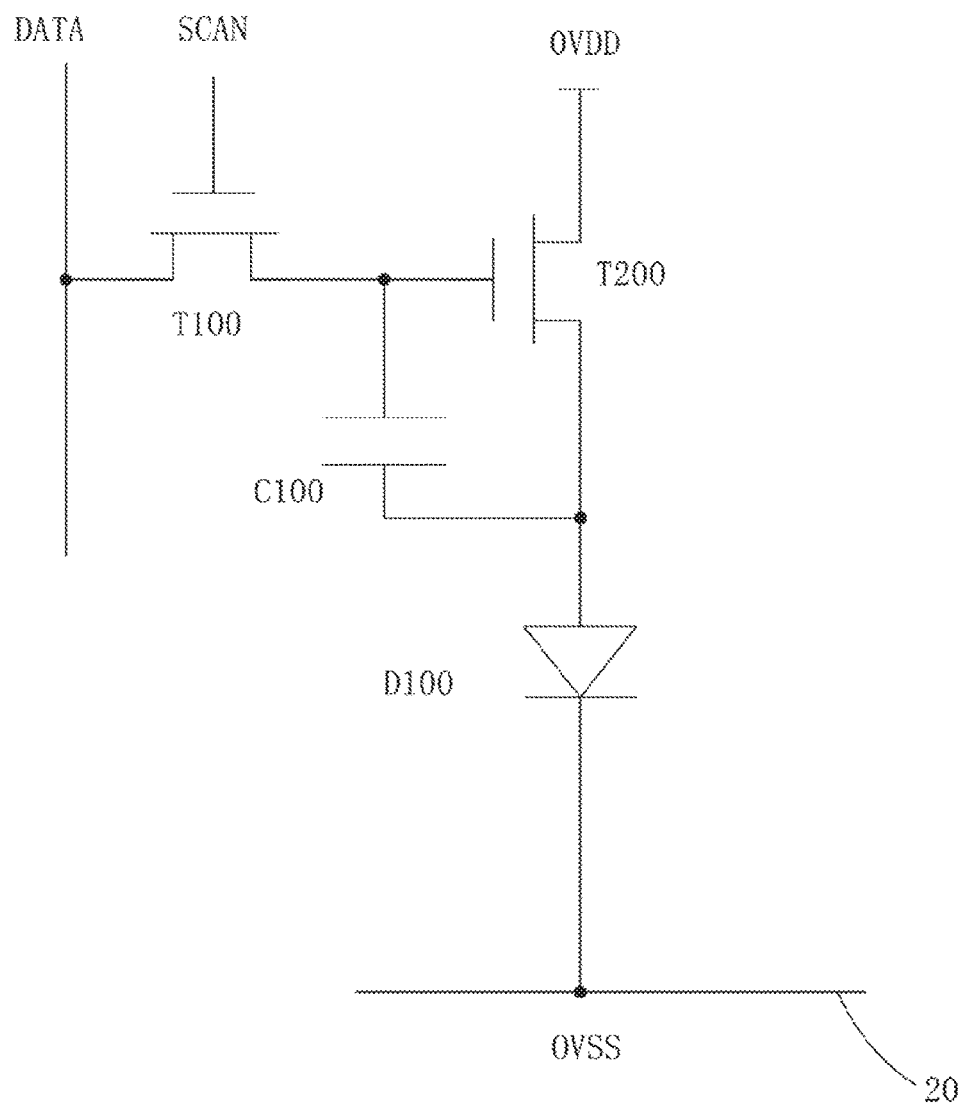
FIG. 2 is an electrical diagram if the subpixel in FIG. 1.
Figure 3:
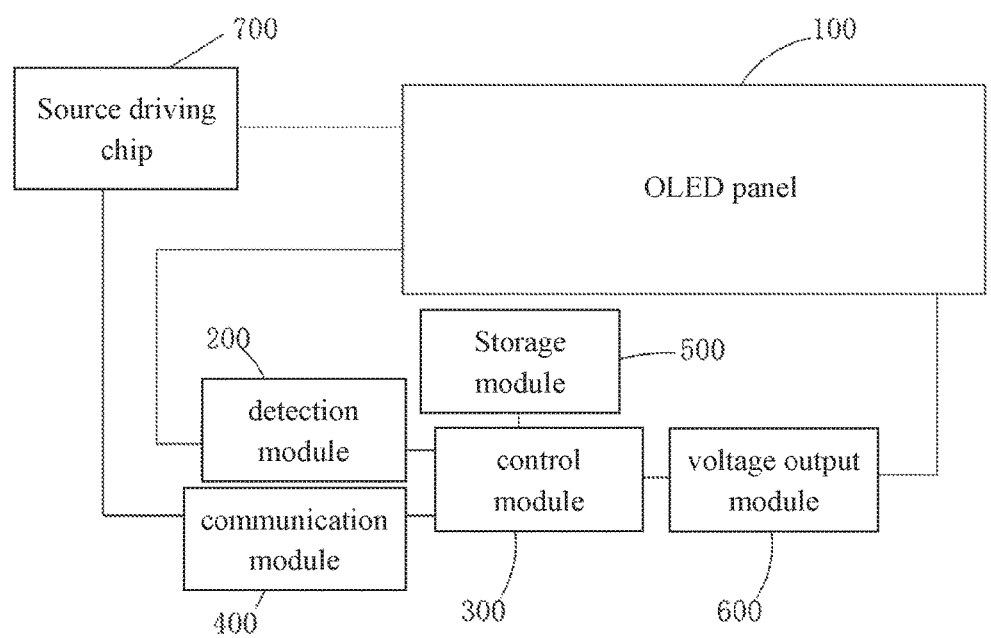
FIG. 3 is a schematic drawing of the embodiment of OLED display device in the present invention.

With reference to FIG. 3. This invention provides an AMOLED display device. The AMOLED display device comprises an OLED panel 100, a detection module 200 electrically connected with the OLED panel 100, a control module 300 electrically connected with the detection module 200, a communication module 400 electrically connected with the control module 300, a storage module 500 electrically connected with the control module 400, and a voltage output module 600 electrically connected with the control module and the OLED panel 100.

Figure 4:
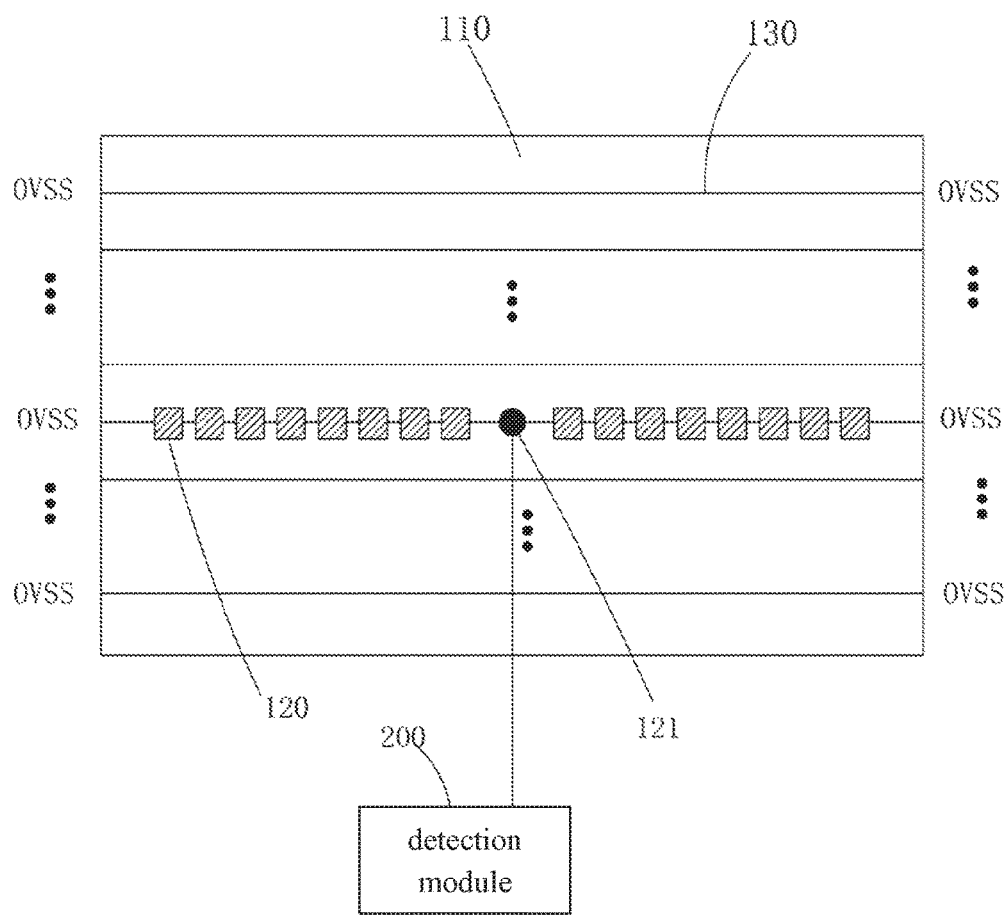
FIG. 4 is a schematic drawing of pone embodiment of OLED panel in the present invention.

With reference to FIG. 4, OLED panel 100 comprises a substrate 110, a plurality of subpixels 120 arranged in an array on the substrate 110, and a plurality of rows of OVSS traces 130 arranged on the substrate 110; each row of subpixels is electrically connected with one of the rows of OVSS trace 130 where a negative voltage applied on; and at least one of the subpixels 120 located in a central area of the substrate 110 is a detecting subpixel 121, and the detecting subpixel 121 is electrically connected with the detection module 200.

To be specific, there is only one detecting subpixel 121 in the middle of the OVSS trace which is located near the center of the substrate 110 in the present embodiment. In the other embodiment, the detecting subpixel can be more than one.

Figure 5:
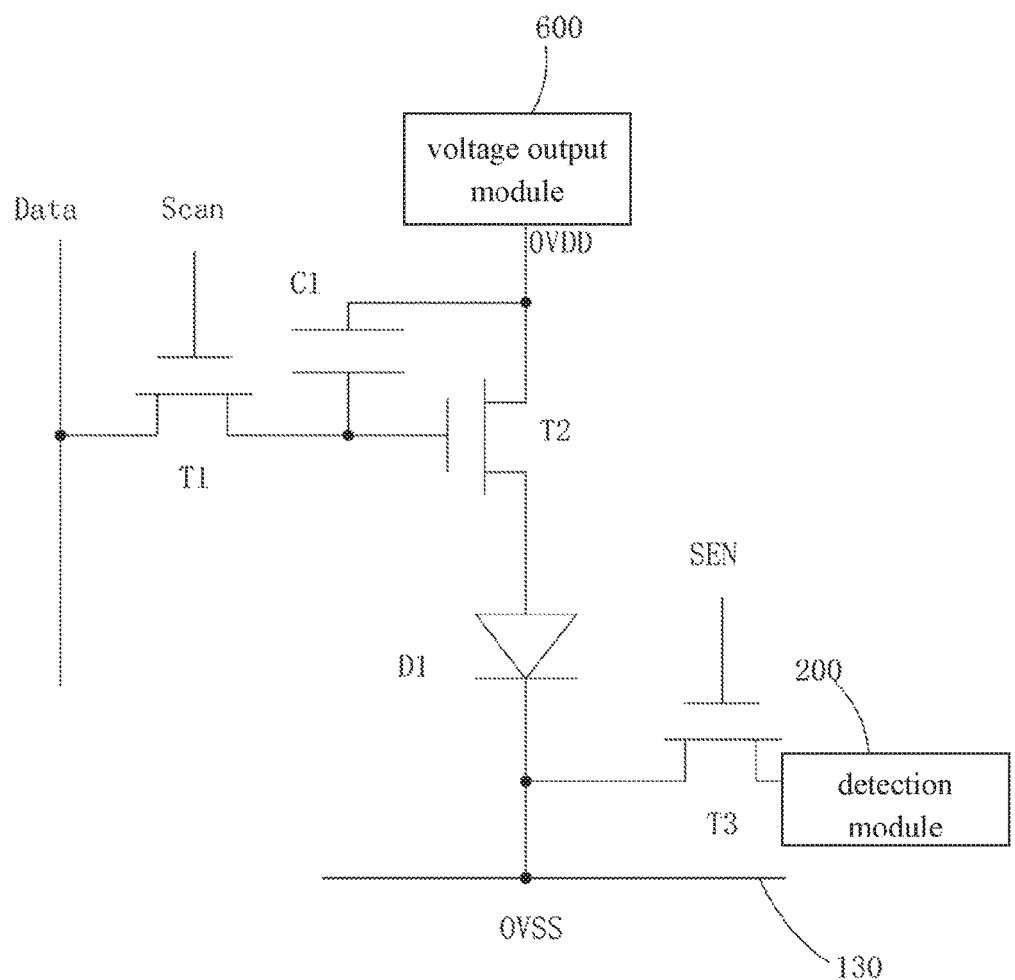
FIG. 5 is an electrical diagram of the detecting subpixel in the present invention.

With reference to FIG. 5, the detecting subpixel 121 comprises a first thin film transistor T1, a second thin film transistor T2, a third thin film transistor T3, a first capacitor C1, and a first organic light emitting diode D1.

With reference to FIG. 5, a gate of the first thin film transistor T1 is electrically connected to a scan signal SCAN, a source of the first thin film transistor is electrically connected to a data signal DATA, and a drain of the first thin film transistor is electrically connected to a gate of the second thin film transistor T2. The second thin film transistor is acting as a driving thin film transistor, and a drain of the second thin film transistor is electrically connected to the voltage output module 600 connecting to the positive voltage OVDD. A source of the second thin film transistor is connected to the anode of the first organic light emitting diode D1. A gate of the third thin film transistor is electrically connected to a sensing signal SEN. A source of the third thin film transistor T3 is electrically connected to a cathode of the first organic light emitting diode D1, the first capacitor C1 is electrically connected to a gate and a drain of the second thin film transistor T2. The cathode of the first organic light emitting diode D1 is electrically connected to the OVSS trace correspondingly.

Figure 6:
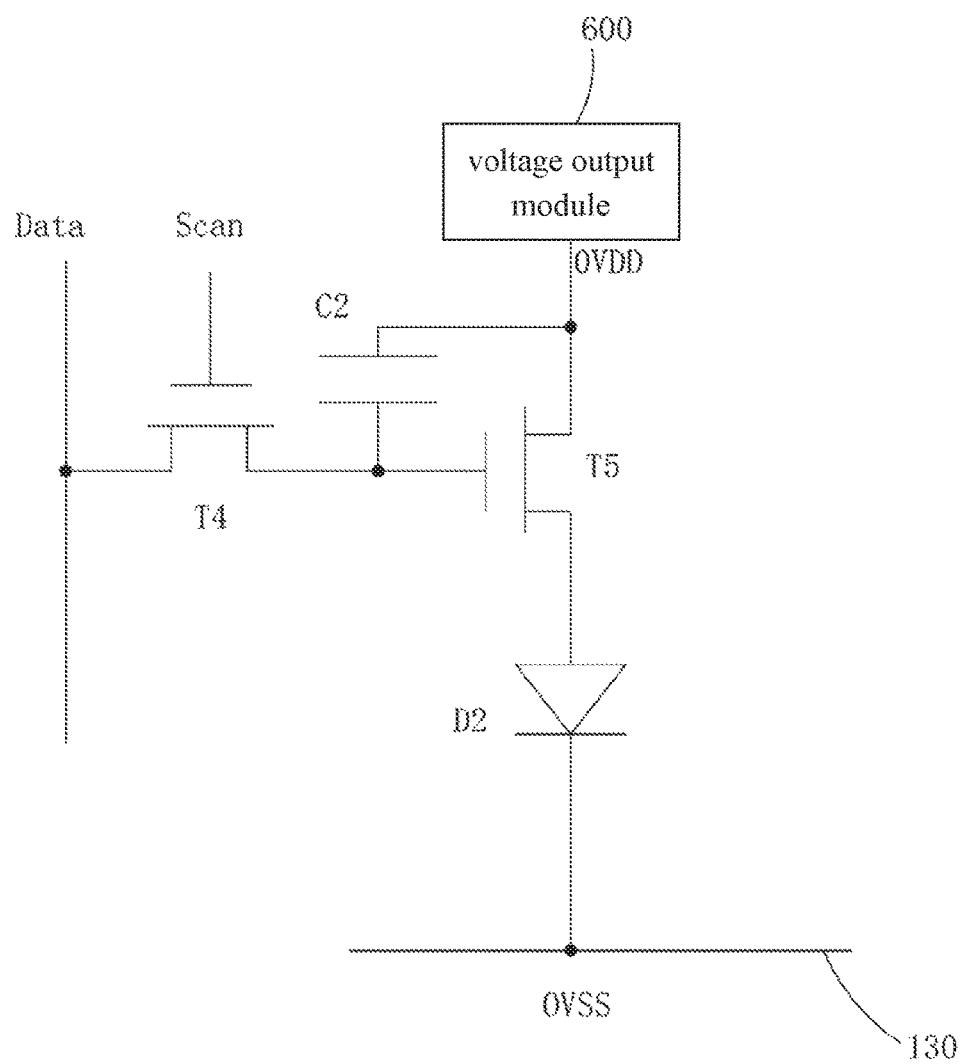
FIG. 6 is an electrical diagram of the subpixel other than the detecting subpixel in the present invention.

With reference to FIG. 6, each of the subpixels 120 other than the detecting subpixel 121 comprises a fourth thin film transistor T4, a fifth thin film transistor T5, a second capacitor C2, and a second organic light emitting diode D2.

A gate of the fourth thin film transistor T4 is connected to the scan signal SCAN, a source is connected to the data signal DATA, and a drain of the fourth thin film transistor T4 is electrically connected to a gate of the fifth thin film transistor T5.

The fifth thin film transistor is acting as a driving thin film transistor. A drain of the fifth thin film transistor T5 is electrically connected to a voltage output module 600 which is electrically connected to the positive voltage OVDD. A source of the fifth thin film transistor T5 is electrically connected to the anode of the second organic light emitting diode D2. Two ends of the second capacitor are electrically connected to the gate and the drain of the fifth thin film transistor T5 respectively. The cathode of the second organic light emitting diode D2 is connected to the OVSS traces 130 correspondingly.

The negative voltage applied on the OVSS traces 130 to the detecting pixel 121 is detected by the detection module to obtain a maximum value of the negative voltage OVSS applied to the detecting subpixel and transmit the maximum value to the control module 300.

When there is only one detecting subpixel 121, the maximum value of the negative voltage applied on the detecting subpixel 121 is the maximum value.

To be specific, after the negative voltage OVSS applied on the VOSS trace 130 to the detecting subpixel 121 is obtained by the detention module, the negative voltage OVSS is converted to digital data format and transmitted to the control module 300.

When the detection module 200 is obtaining the negative voltage OVSS applied on the OVSS trace 130 to the detecting subpixel 121, the sense signal SEN will control the third thin film transistor T3 to be turned on.

The communication module 400 is for receiving the display signal from the control module 300. The display signal comprises a highest grayscale value or a highest data signal voltage in a picture to be displayed, and a frame synchronization signal.

The storage module is for storing the relationship of the highest grayscale or the highest data signal voltage of the picture to be displayed, the negative voltage OVSS and the minimum positive voltage to form a look-up table.

To be specific, the relationship of the highest grayscale or the highest data signal voltage of the picture to be displayed, the negative voltage OVSS and the minimum positive voltage is obtained by the IV curve of a plurality of the driving thin film transistors in the subpixel 120. The minimum positive voltage is a minimum voltage at a certain highest grayscale or highest data signal voltage and a certain negative voltage to ensure the driving thin film transistor of the subpixels to stay in the saturation region.

The control signal corresponding to the minimum positive voltage is obtained by the control module 300 according to the highest grayscale value, highest data signal voltage, and the maximum value of the negative voltage OVSS applied to the detecting subpixel 121 from the look-up table stored in the storage module 400 and transmitted to the voltage output module 600 to update the a frame synchronization signal.

The voltage output module 600 is for generating the positive voltage OVDD to the OLED panel 100 according to the control signal.

To be clear, with reference to FIG. 3, the AMOLED display device further comprises a source driver chip 700 electrically connected to the communication module 400 and the OLED panel 100 in this embodiment.

Figure 7:
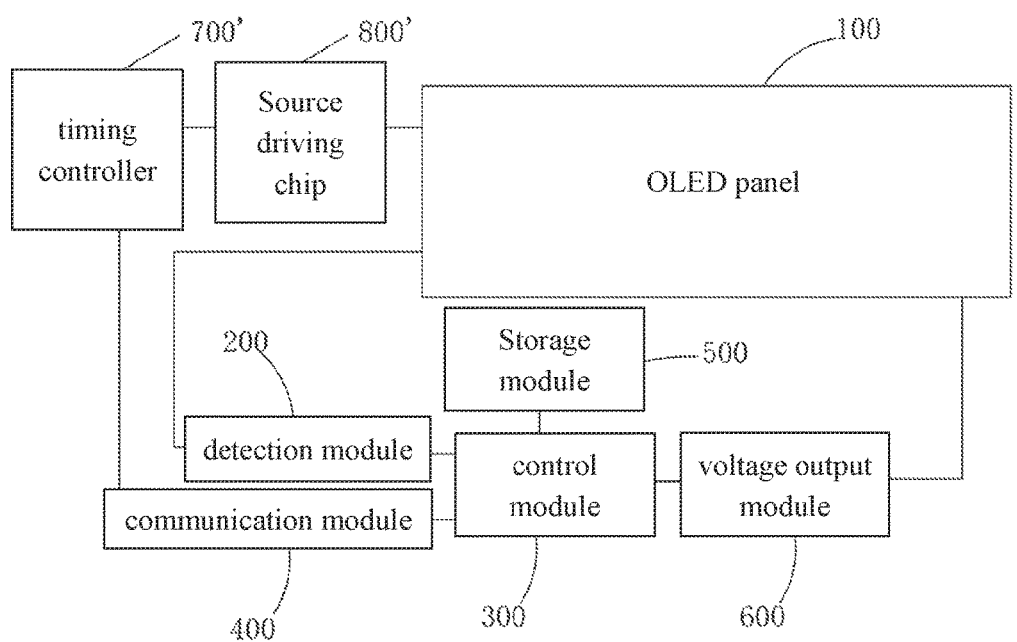
FIG. 7 is a schematic drawing of another embodiment of OLED display device in the present invention.

With reference to FIG. 7, the difference between this embodiment and previous embodiment is that the AMOLED display device further comprises a timing controller 700 electrically connected to the communication module 400 and a source driver chip 800 electrically connected to both the timing controller 700 and the OLED panel 100, wherein the display signal is transmitted by the timing controller 700 to the communication module 400.

To be specific, the AMOLED display device in the present invention set at least one subpixel 120 in the center region of the substrate 110 as a detecting subpixel 121 and an anode of the first organic light emitting diode D1 and the corresponding OVSS trace 130 are connected with the detection module 200. The negative voltage OVSS applied on the detecting subpixel 121 is detected by the detection module 200 to obtain the maximum value of the negative voltage OVSS. The communication module 400 is for receiving the highest grayscale value or highest data signal voltage. The control module 300 is for obtaining the minimum positive voltage from the look-up table stored in the storage module 500 according to the highest grayscale value or highest data signal voltage and the maximum negative voltage OVSS applied on the detecting subpixel and generating a control signal. The minimum voltage is the voltage to make the driving thin film transistor in a plurality of subpixels 121 in the saturation region of the IV curve. The control module 600 outputs the positive voltage OVDD (i.e. the minimum positive voltage) to the OLED panel 100 according to the control signal to ensure all the subpixels 120 are under the saturation region in the IV curve, lower down the power consumption and maintain the display quality.

Figure 8:
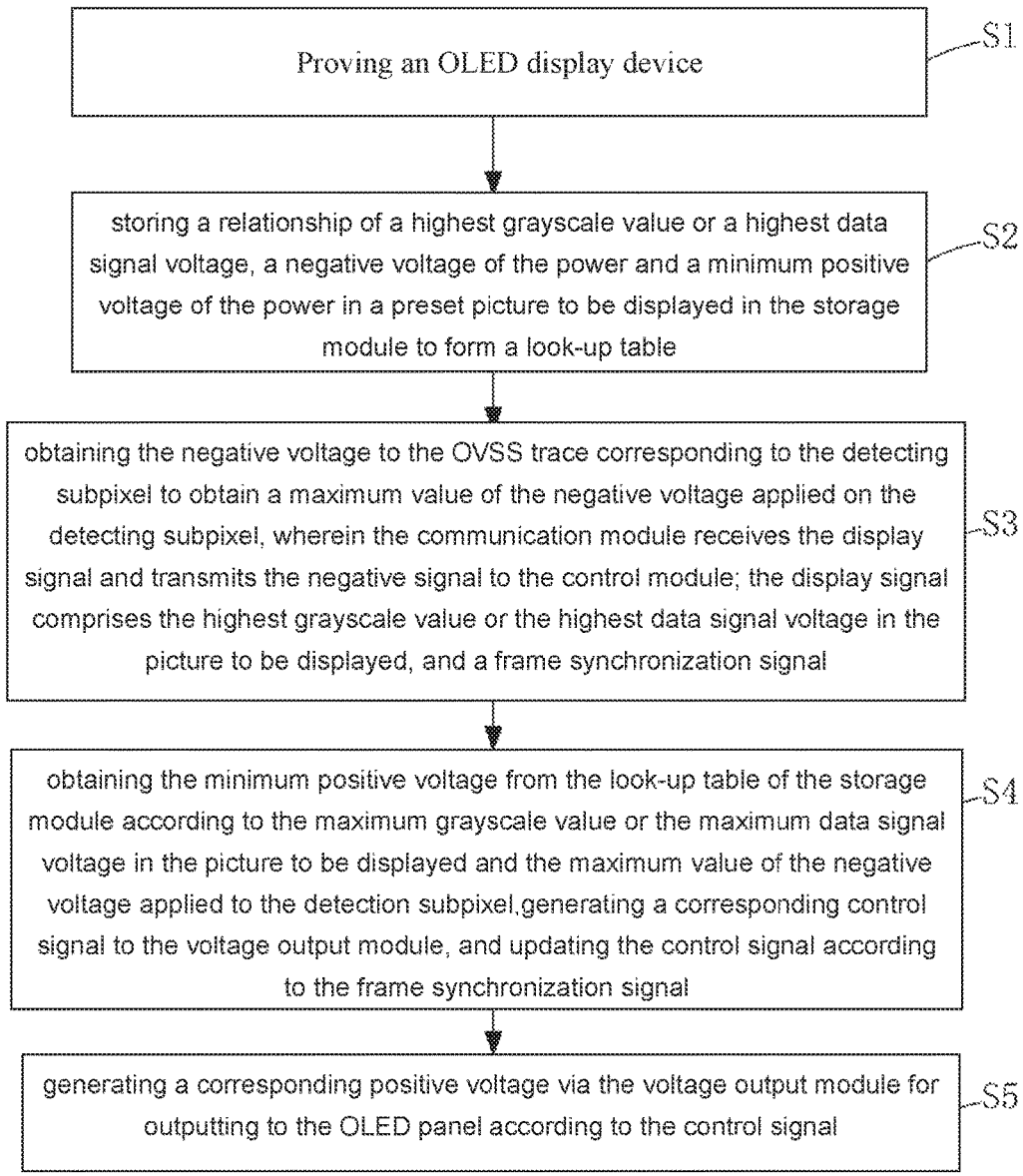
FIG. 8 is a flowchart of the driving method of the present invention.

With reference to FIG. 8, this invention also provides a driving method of the AMOLED display device comprise the follow step With reference to FIGS. 3-7, step S1 is providing the AMOLED display device aforesaid.

Step S2 is storing a relationship of a highest grayscale value or a highest data signal voltage, a negative voltage and a minimum positive voltage in a preset picture to be displayed in the storage module 500 to form a look-up table;

To be specific, the relationship of the highest grayscale or the highest data signal voltage of the picture to be displayed, the negative voltage OVSS and the minimum positive voltage is obtained by the IV curve of a plurality of the driving thin film transistors in the subpixel 120. The minimum positive voltage is a minimum voltage at a certain highest grayscale or highest data signal voltage and a certain negative voltage to ensure the driving thin film transistor of the subpixels to stay in the saturation region.

Step S3 is obtaining the negative voltage to the OVSS trace 130 corresponding to the detecting subpixel 121 to obtain a maximum value of the negative voltage applied on the detecting subpixel 121, The communication module 400 receives the display signal and transmits the negative signal to the control module 300; the display signal comprises the highest grayscale value or the highest data signal voltage in the picture to be displayed, and a frame synchronization signal.

To be clear, with reference to FIG. 3, the AMOLED display device further comprises a source driver chip 700 electrically connected to the communication module 400 and the OLED panel 100 in this embodiment. In the step S3, the source driving chip 700 is transmitting the display signal to the communication module 400.

With reference to FIG. 7, the AMOLED display device further comprises a timing controller 700' electrically connected to the communication module 400 and a source driver chip 800' electrically connected to both the timing controller 700 and the OLED panel 100, wherein the display signal is transmitted by the timing controller 700 to the communication module 400. In the step S3, the source driving chip 700 is transmitting the display signal to the communication module 400.

In step S3, when the detection module 200 is obtaining the negative voltage OVSS applied on the OVSS trace 130 to the detecting subpixel 121, the sense signal SEN will control the third thin film transistor T3 to be turned on To be specific, after the negative voltage OVSS applied on the VOSS trace 130 to the detecting subpixel 121 is obtained by the detention module, the negative voltage OVSS is converted to digital data format and transmitted to the control module 300.

Step S4 is obtaining the minimum positive voltage from the look-up table of the storage module according to the maximum grayscale value or the maximum data signal voltage in the picture to be displayed and the maximum value of the negative voltage applied to the detecting subpixel 121, generating a corresponding control signal to the voltage output module 600, and updating the control signal according to the frame synchronization signal.

Step S5 is generating a corresponding positive voltage OVDD via the voltage output module 600 for outputting to the OLED panel 100 according to the control signal.

To be specific, the AMOLED display device in the present invention sets at least one subpixel 120 in the center region of the substrate 110 as a detecting subpixel 121 and an anode of the first organic light emitting diode D1 and the corresponding OVSS trace 130 are connected with the detection module 200, The negative voltage OVSS applied on the detecting subpixel 121 is detected by the detection module 200 to obtain the maximum value of the negative voltage OVSS. The communication module 400 is for receiving the highest grayscale value or highest data signal voltage. The control module 300 is for obtaining the minimum positive voltage from the look-up table stored in the storage module 500 according to the highest grayscale value or highest data signal voltage and the maximum negative voltage OVSS applied on the detecting subpixel and generating a control signal. The minimum voltage is the voltage to make the driving thin film transistor in a plurality of subpixels 121 in the saturation region of the IV curve. The control module 600 outputs the positive voltage OVDD (i.e. the minimum positive voltage) to the OLED panel 100 according to the control signal to ensure all the subpixels 120 are under the saturation region in the IV curve, lower down the power consumption and maintain the display quality.

Overall, this invention provides an AMOLED display device. The OLED panel comprises a plurality of subpixels, Each row of subpixels is electrically connected with one of the rows of OVSS. At least one of the subpixels located in a central area of the substrate is a detecting subpixel. While driving, a maximum value of the negative voltage of the detecting pixel is detected by the detection module, and the corresponding minimum positive voltage is obtained from the look-up table stored in the storage module according to the highest grayscale value and or the highest data signal voltage, and the maximum value of the negative voltage. Then a corresponding positive voltage to the OLED panel is generated from the voltage output module which is controlled by the control signal. This technology improves the power consumption of the AMOLED device significantly and the display quality. This invention provides a driving method of AMOLED display device with low power consumption and high display quality.

In view of the above, those skilled in the art can make various other corresponding changes and modifications according to the technical solutions of the present invention, and all such changes and modifications shall fall within the protection scope of the claims of the present invention.

What is claimed is:

1. An AMOLED display device, comprising an OLED panel, a detection module electrically connected with the OLED panel, a control module electrically connected with the detection module, a communication module electrically connected with the control module, a storage module electrically connected with the control module, and a voltage output module electrically connected with the control module and the OLED panel;

wherein the OLED panel comprises a substrate, a plurality of subpixels arranged in an array on the substrate, and a plurality of rows of OVSS traces arranged on the substrate; each row of subpixels is electrically connected with one of the rows of OVSS where a negative voltage applied on; and at least one of the subpixels located in a central area of the substrate is a detecting subpixel, and the detecting subpixel is electrically connected with the detection module;

wherein the detection module is for obtaining the negative voltage applied on the OVSS trace to the corresponding detecting subpixel to obtain a maximum value of the negative voltage applied to the detecting subpixel and transmit the maximum value to the control module; the communication module is for receiving a display signal and transmitting the display signal to the control module, the display signal comprises a highest grayscale value or a highest data signal voltage in a picture to be displayed, and a frame synchronization signal; the storage module is for storing a relationship of the highest grayscale or the highest data signal, the negative voltage, and a minimum positive voltage of the picture to be displayed, and forming a look-up table; the control module is for obtaining a minimum positive voltage from the look-up table stored in the storage module according to the value of the maximum grayscale or the maximum data signal voltage in the picture to be displayed and the maximum value of the negative voltage applied on the detecting subpixel, and for generating a control signal from the look-up table to be transmitted to the voltage output module and updating the control signal according to the frame synchronization signal; and the voltage output module is for generating a corresponding positive voltage output to the OLED panel according to the control signal.

2. The AMOLED display device according to claim 1, wherein the detecting subpixel comprise a first thin film transistor, a second thin film transistor, a third thin film transistor, a first capacitor, and a first organic light emitting diode;

wherein a gate of the first thin film transistor is electrically connected to a scan signal, a source of the first thin film transistor is electrically connected to a data signal, and a drain of the first thin film transistor is electrically connected to a gate of the second thin film transistor; a drain of the second thin film transistor is electrically connected to the voltage output module connecting to the positive voltage and a source of the second thin film transistor is connected to the anode of the first organic light emitting diode; a gate of the third thin film transistor is electrically connected to a sensing signal, a source of the third thin film transistor is electrically connected to a cathode of the first organic light emitting diode, the first capacitor is electrically connected to a gate and a drain of the second thin film transistor; the cathode of the first organic light emitting diode is electrically connected to the OVSS trace correspondingly;

wherein each of the subpixels other than the detection subpixel comprises a fourth thin film transistor, a fifth thin film transistor, a second capacitor, and a second organic light emitting diode;

wherein a gate of the fourth thin film transistor is connected to the scan signal, a source is connected to the data signal, and a drain of the fourth thin film transistor is electrically connected to a gate of the fifth thin film transistor; a drain of the fifth thin film transistor is electrically connected to a voltage output module which is electrically connected to the anode of the positive voltage, a source of the fifth thin film transistor is electrically connected to the anode of the second organic light emitting diode; two ends of the second capacitor are electrically connected to the gate and the drain of the fifth thin film transistor respectively; the cathode of the second organic light emitting diode connecting to the OVSS traces correspondingly.

3. The AMOLED display device according to claim 2, wherein the detecting module obtains the negative voltage applied on the OVSS trace corresponding to the detecting subpixel, the sensing signal controls the third thin film transistor to be turned on.

4. The AMOLED display device according to claim 1, comprising a source driver chip electrically connected to the communication module and the OLED panel, the display signal being transmitted from the source driver chip to the communication module.

5. The AMOLED display device according to claim 1, comprising a timing controller electrically connected to the communication module and a source driver chip electrically connected to both the timing controller and the OLED panel, wherein the display signal is transmitted by the timing controller to the communication module.

6. A driving method of AMOLED display device, comprising:

step S1, providing the AMOLED display device according to claim 1;

step S2, storing a relationship of a highest grayscale value or a highest data signal voltage, a negative voltage of the power and a minimum positive voltage of the power in a preset picture to be displayed in the storage module to form a look-up table;

step S3: obtaining the negative voltage to the OVSS trace corresponding to the detecting subpixel to obtain a maximum value of the negative voltage applied on the detecting subpixel, wherein the communication module receives the display signal and transmits the negative signal to the control module; the display signal comprises the highest grayscale value or the highest data signal voltage in the picture to be displayed, and a frame synchronization signal;

step S4: obtaining the minimum positive voltage from the look-up table of the storage module according to the maximum grayscale value or the maximum data signal voltage in the picture to be displayed and the maximum value of the negative voltage applied to the detection subpixel, generating a corresponding control signal to the voltage output module, and updating the control signal according to the frame synchronization signal; and Step S5, generating a corresponding positive voltage via the voltage output module for outputting to the OLED panel according to the control signal.

7. The driving method according to claim 6, wherein the detecting subpixel comprises a first thin film transistor, a second thin film transistor, a third thin film transistor, a first capacitor and a first organic light emitting diode;

wherein a gate of the first thin film transistor is connected to a scan signal, a source of the first thin film transistor is connected to a data signal, and a drain of the first thin film transistor is electrically connected to a gate of the second thin film transistor; a drain of the second thin film transistor is electrically connected to a voltage output module which is connected to a anode of a positive voltage and a source of the second thin film transistor is connected to the anode of the first organic light emitting diode; a gate of the third thin film transistor is electrically connected to the sensing signal, a source of the third thin film transistor is electrically connected to a cathode of the first organic light emitting diode, the first capacitor is electrically connected to a gate and a drain of the second thin film transistor; and the cathode of the first OLED is electrically connected to the OVSS trace correspondingly;

wherein each of the subpixels other than the detection subpixel comprises a fourth thin film transistor, a fifth thin film transistor, a second capacitor, and a second organic light emitting diode;

wherein a gate of the fourth thin film transistor is connected to the scan signal, a source is connected to the data signal, and a drain of the fourth thin film transistor is electrically connected to a gate of the fifth thin film transistor; a drain of the fifth thin film transistor is electrically connected to a voltage output module which is electrically connected to the anode of the positive voltage, a source of the fifth thin film transistor is electrically connected to the anode of the second organic light emitting diode; two ends of the second capacitor are electrically connected to the gate and the drain of the fifth thin film transistor respectively; the cathode of the second organic light emitting diode connecting to the OVSS traces correspondingly.

8. The driving method for the AMOLED display device according to claim 7, wherein step S3 further comprises the sensing signal controls the third thin film transistor to be turned on when the detecting module obtains the negative voltage to the OVSS trace corresponding to the detecting subpixel.

9. The driving method for the AMOLED display device according to claim 6, wherein the AMOLED display device comprises a source driver chip electrically connected to the communication module and the OLED panel, and the source driver chip transmits the display signal to the communication module in step S3.

10. The driving method for the AMOLED display device according to claim 6, the AMOLED display device comprising a timing controller electrically connected with the communication module and a source driver chip electrically connected with the timing controller and the OLED panel, wherein the timing controller transmits the display signal to the communication module in Step S3.

11. An AMOLED display device, comprising an OLED panel, a detection module electrically connected with the OLED panel, a control module electrically connected with the detection module, a communication module electrically connected with the control module, the control module electrically connected with the storage module, and voltage output module electrically connected to the control module and the OLED panel;

the OLED panel comprising a substrate, a plurality of subpixels arranged in array on the substrate, and a plurality of rows of OVSS traces arranged on the substrate, each row of subpixels is correspondingly electrically connected with a row of OVSS traces and is formed by a corresponding OVSS and at least one sub-pixel located in a central area of the substrate is a detection sub-pixel, and the detection sub-pixel is electrically connected with the detection module;

the detection module is configured to acquire a negative voltage of the power input to the OVSS trace corresponding to the detection sub-pixel to obtain a maximum value of the negative voltage of the power input to the detection sub-pixel and transmit the maximum value to the control module; the communication module is configured to receive a display signal and transmit the control signal to a control module, wherein the display signal comprise a highest grayscale value or a highest data signal voltage in a picture to be displayed, and a frame synchronization signal;

the storage module is configured to store a preset between a highest grayscale value or a highest data signal voltage, a negative voltage, and a minimum positive voltage to be displayed, and forming a look-up table; according to a maximum grayscale value or a maximum data signal voltage in a picture to be displayed and a maximum value of a negative voltage input to the detection sub-pixel, the control module is configured to obtain a corresponding minimum positive voltage forming a look-up table of the memory module, generating a corresponding control signal from the look-up table to be transmitted to the voltage output module and configuring to update the control signal according to the frame synchronization signal;

the voltage output module is configured to generate a corresponding positive power voltage output to the OLED panel according to the control signal, wherein the detecting sub-pixel comprises a first thin film transistor, a second thin film transistor, a third thin film transistor, a first capacitor, and a first organic light emitting diode, a gate electrode of the first thin film transistor is connected to a scan signal, a source electrode is connected to a data signal, and a drain electrode is electrically connected to a gate electrode of the second thin film transistor; a drain electrode of the second thin film transistor is electrically connected to a voltage output module and the voltage, the cathode is electrically connected to the anode of the first organic light emitting diode; the gate of the third thin film transistor is connected to the sensing signal, the source of the third thin film transistor is electrically connected to the cathode of the first organic light emitting diode, the first capacitor is electrically connected to the gate and the drain of the second thin film transistor; the cathode of the first OLED is electrically connected to a corresponding OVSS trace; each of the sub-pixels excluding the detection sub-pixel comprises a fourth thin film transistor, a fifth thin film transistor, a second capacitor, and a second organic light emitting diode;

a gate of the fourth thin film transistor is connected to a scan signal, a source is connected to a data signal, and a drain of the fourth thin film transistor is electrically connected to a gate of the fifth thin film transistor; a drain of the fifth thin film transistor is electrically connected to a voltage output module and the voltage, the cathode is electrically connected to the anode of the second organic light emitting diode; the two ends of the second capacitor are electrically connected to the gate and the drain of the fifth thin film transistor respectively; the cathode of the second organic light emitting diode connecting to the corresponding OVSS traces;

wherein the detecting module obtains the negative voltage to the OVSS trace corresponding to the detecting sub-pixel, the sensing signal controls the third thin film transistor to be turned on;

wherein the device further comprises a source driver chip electrically connected to the communication module and the OLED panel, the display signal being transmitted from the source driver chip to the communication module.

* * * * *